(12) United States Patent
Hsu et al.

(10) Patent No.: US 9,383,650 B2
(45) Date of Patent: *Jul. 5, 2016

(54) EXPOSURE APPARATUS AND EXPOSURE METHOD

(75) Inventors: Jehao Hsu, Shenzhen (CN); Minghung Shih, Shenzhen (CN); Jingfeng Xue, Shenzhen (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 1224 days.

This patent is subject to a terminal disclaimer.

(21) Appl. No.: 13/381,350

(22) PCT Filed: Dec. 16, 2011

(86) PCT No.: PCT/CN2011/084102
§ 371 (c)(1),
(2), (4) Date: Dec. 28, 2011

(87) PCT Pub. No.: WO2013/086730
PCT Pub. Date: Jun. 20, 2013

(65) Prior Publication Data
US 2013/0155383 A1    Jun. 20, 2013

(30) Foreign Application Priority Data
Dec. 15, 2011 (CN) .......................... 2011 1 0418418

(51) Int. Cl.
G03F 7/20 (2006.01)
(52) U.S. Cl.
CPC .......... *G03F 7/2032* (2013.01); *G03F 7/70325* (2013.01)
(58) Field of Classification Search
CPC ................ G03F 7/2032; G03F 7/2022; H05K 2203/1572
See application file for complete search history.

(56) References Cited

U.S. PATENT DOCUMENTS

| 4,639,127 | A  | * | 1/1987  | Beery ................... G03F 7/0022 250/208.1 |
| 5,876,884 | A  | * | 3/1999  | Maeda ...................... G03F 9/70 355/75 |
| 5,900,974 | A  | * | 5/1999  | Wilkinson ............... 359/488.01 |
| 9,041,909 | B2 | * | 5/2015  | Shih et al. ........................ 355/67 |
| 2009/0289257 | A1 | * | 11/2009 | Sakurai ........................... 257/59 |

FOREIGN PATENT DOCUMENTS

JP    56167135 A  * 12/1981

* cited by examiner

*Primary Examiner* — Steven H Whitesell Gordon

(57) ABSTRACT

The present invention provides an exposure apparatus and an exposure method. The method comprises: utilizing an exposure light source to provide light rays to the photo-resist layer; and utilizing a reflective plate to reflect the light rays passing through the photo-resist layer and the transparent substrate back to the photo-resist layer. The present invention can reduce a line space of a pattern of the photo-resist layer.

15 Claims, 4 Drawing Sheets

EXPOSURE APPARATUS AND EXPOSURE METHOD

FIELD OF THE INVENTION

The present invention relates to a field of an exposure technology, and more particularly to an exposure apparatus and an exposure method.

BACKGROUND OF THE INVENTION

A photo-lithography technology has been widely applied in manufacturing processes of electrical products. With the use of the photo-lithography technology, a photo-resist is exposed to form different patterns. However, when a line space of a pattern of the photo-resist is too small, the photo-resist has a lower transmittance, and thus a portion of the photo-resist is not exposed and is still non-patterned. Therefore, after the photo-lithography process, the formed pattern can not meet the requirement of a predetermined pattern, and the performance of the electrical products is limited.

Specifically, in many current electrical devices, such as liquid crystal displays (LCDs), the line space of the pattern thereof is required to be reduced continuously for promoting the performance of the electrical devices.

As a result, it is necessary to provide an exposure apparatus and an exposure method to solve the problems existing in the conventional technologies, as described above.

SUMMARY OF THE INVENTION

The present invention provides an exposure apparatus and an exposure method for reducing a line space of a pattern of a photo-resist layer.

A primary object of the present invention is to provide an exposure apparatus for exposing a photo-resist layer on a transparent substrate, and the exposure apparatus comprises: a mask disposed at one side of the photo-resist layer; an exposure light source configured to provide light rays to the photo-resist layer, wherein the light rays provided by the exposure light source pass through the mask to reach the photo-resist layer; and a reflective plate disposed at an opposite side of the photo-resist layer for reflecting the light rays passing through the photo-resist layer and the transparent substrate back to the photo-resist layer.

Another object of the present invention is to provide an exposure method for exposing a photo-resist layer on a transparent substrate, and the exposure method comprises the following steps: utilizing an exposure light source to provide light rays to the photo-resist layer, wherein the light rays provided by the exposure light source pass through the mask to reach the photo-resist layer; and utilizing a reflective plate to reflect the light rays passing through the photo-resist layer and the transparent substrate back to the photo-resist layer.

In one embodiment of the present invention, when utilizing the reflective plate to reflect the light rays, the transparent substrate is carried on the reflective plate.

In one embodiment of the present invention, the mask includes at least one transparent opening, and a width of the transparent opening is less than 3 um.

In one embodiment of the present invention, the width of the transparent opening is equal to or less than 2 um.

In one embodiment of the present invention, characterized in that: a reflective surface of the reflective plate is a flat surface.

In one embodiment of the present invention, the reflective plate includes a plurality of convex structures.

In one embodiment of the present invention, the reflective plate includes a plurality of concave structures.

In one embodiment of the present invention, the reflective plate is parallel to the photo-resist layer on the transparent substrate when exposing the photo-resist layer.

With the use of the exposure apparatus and the exposure method of the present invention, it can be ensured that an exposed portion of the photo-resist layer can be patterned completely, so as to prevent that the photo-resist layer can not be expose sufficiently due to a small line space or a high depth-to-width ratio. Therefore, by means of the exposure apparatus and the exposure method of the present invention, the line space of the desired pattern can be reduced for promoting the performance of electrical devices.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
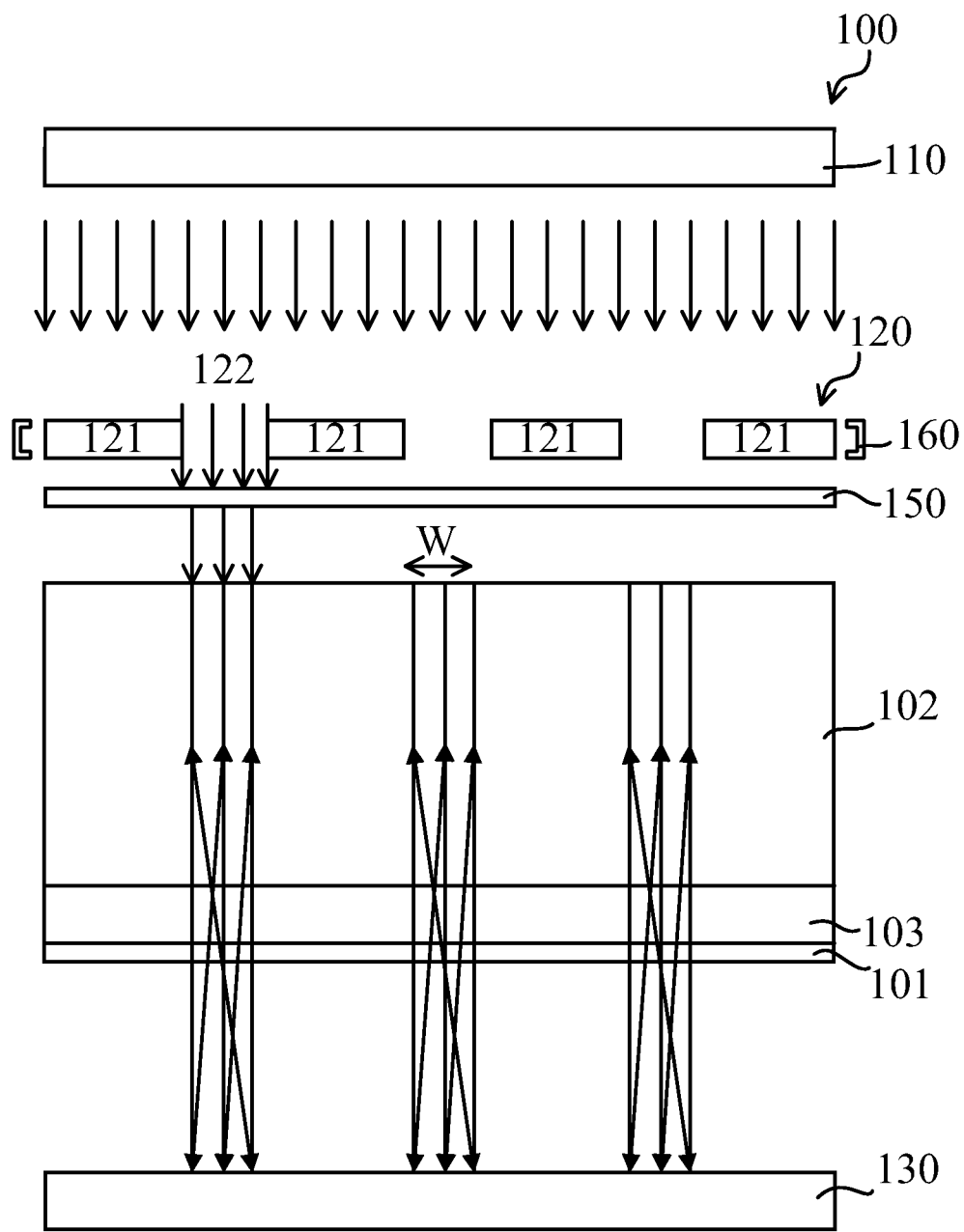
FIG. 1 is a schematic diagram showing an exposure apparatus according to a first embodiment of the present invention.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, structure-like elements are labeled with like reference numerals.

Referring to FIG. 1, a schematic diagram showing an exposure apparatus according to a first embodiment of the present invention is illustrated. The exposure apparatus 100 of the present invention is configured to expose a photo-resist layer 102 on a transparent substrate 101 for patterning the photo-resist layer 102. In this case, the transparent substrate 101 may be a transparent glass substrate or a transparent flexible plastic substrate. The material of the photo-resist layer 102 may be a positive resist material or a negative resist material. It is worth mentioning that, before exposing the photo-resist layer 102, there may be one or more layer structures 103 between the photo-resist layer 102 and the transparent substrate 101, and the one or more layer structures 103 are preferably transparent structures for allowing light rays to pass from the one or more layer structures 103 from the photo-resist layer 102 to the transparent substrate 101.

Referring to FIG. 1 again, the exposure apparatus 100 of the present embodiment can comprise an exposure light source 110, a mask 120 and a reflective plate 130. The exposure light source 110 is configured to provide light rays to the photo-resist layer 102 on the transparent substrate 101. The mask 120 is disposed between the exposure light source 110 and the transparent substrate 101 for allowing a portion of the light rays to pass, so as to pattern the photo-resist layer 102. The reflective plate 130 is configured to reflect the light rays passing through the photo-resist layer 102 and the transparent substrate 101 back to the photo-resist layer 102, so as to increase an exposed extent of the photo-resist layer 102, and thus a portion of the photo-resist layer 102 designed to be patterned can be completely exposed for ensuring the forming of a predetermined pattern.

Referring to FIG. 1 again, the exposure light source 110 of the present embodiment may be a metal halide lamp, a mercury lamp, a fluorescent lamp, a UV lamp or a laser source for emitting exposure light rays. The exposure light rays emitted from the exposure light source 110 are preferably ultraviolet light rays or the light rays (such as laser light) with a wavelength less than the ultraviolet light. The exposure light source 110 can directly face to the transparent substrate 101 for emitting the light rays to the transparent substrate 101. In another embodiment, the exposure light rays emitted from the exposure light source 110 may be transmitted to the transparent substrate 101 through an optical system (not shown) which is composed of a plurality of lens.

Referring to FIG. 1 again, the mask 120 of the present embodiment is disposed at one side of the photo-resist layer 102 (such as an upside) and positioned between the exposure light source 110 and the photo-resist layer 102 on the transparent substrate 101. The mask 120 includes an opaque pattern 121 and at least one transparent opening (or slit) 122. The material of the opaque pattern 121 may be chromium (Cr) to shelter a portion of the light rays emitted from the exposure light source 110 for patterning the photo-resist layer 102. The mask 120 may be directly close to a surface of the photo-resist layer 102. At this time, a width (such as 2 um) of the transparent opening 122 may be substantially equal to or similar to a width W (such as 2 um) of an exposed area on the surface of the photo-resist layer 102. In another embodiment, the exposure apparatus 100 may further comprise a projection reduction lens system 150 disposed between the mask 120 and the transparent substrate 101 for projecting the light rays passing through the mask 120 to the surface of the photo-resist layer 102. At this time, the width (such as 10 um) of the transparent opening 122 may be greatly larger than the width W (such as 2 um) of the exposed area on the top surface of the photo-resist layer 102. Moreover, the mask 120 can be positioned to the photo-resist layer 102 on the transparent substrate 101 by using an aligner 160.

Referring to FIG. 1 again, the reflective plate 130 of the present embodiment is disposed at an opposite side (such a underside) of the photo-resist layer 102 for reflecting the light rays passing through the photo-resist layer 102 and the transparent substrate 101, so as to allow the light rays to be reflected back to the photo-resist layer 102, thereby increasing the exposed extent of the photo-resist layer 102, as well as preventing that a bottom portion (a portion close to the transparent substrate 101) of the photo-resist layer 102 is exposed insufficiently. Therefore, it is ensured that the photo-resist layer 102 is completely exposed, and the exposed pattern of the photo-resist layer 102 can meet the precise requirement of the predetermined pattern. When exposing the photo-resist layer 102, the reflective plate 130 is preferably and substantially parallel to the photo-resist layer 102 on the transparent substrate 101, so as to directly reflect the light rays passing through the transparent substrate 101 back to the photo-resist layer 102 in the total reflection manner, so as to enhance the precision of the exposed pattern of the photo-resist layer 102. The reflective plate 130 includes a highly reflective material, such as Ag, Al, Au or white paint (such as titanium oxide) for reflecting the light rays. The reflective plate 130 may be made of the highly reflective material (such as metal) as one-piece. Alternatively, the highly reflective material can be coated on a plate (not shown) to form the reflective plate 130. In this embodiment, a reflective surface of the reflective plate 130 can be a flat surface. That is, the reflective plate 130 can act as a plane mirror.

In one embodiment, when exposing the photo-resist layer 102, the transparent substrate 101 can be carried on the reflective plate 130. At this time, the bottom surface of the transparent substrate 101 can contact with the reflective surface of the reflective plate 130. In another embodiment, a transparent plate can be disposed between the transparent substrate 101 and the reflective plate 130 for carrying the transparent substrate 101 and allowing the light rays to pass.

Referring to FIG. 1 again, the exposure method can comprise the following steps: utilizing an exposure light source 110 to provide light rays to the photo-resist layer 102, wherein the light rays provided by the exposure light source 110 pass through the mask 120 to reach the photo-resist layer 102; and utilizing a reflective plate 130 to reflect the light rays passing through the photo-resist layer 102 and the transparent substrate 101 back to the photo-resist layer 102.

For example, referring to FIG. 1 again, when applying the exposure apparatus 100 to a process for manufacturing the LCD panel, the transparent substrate 101 may be the glass substrate, and a transparent electrode layer (such as ITO layer) 103 desired to be patterned is formed between the photo-resist layer 102 and the transparent substrate 101. When using the exposure apparatus 100 of the present embodiment to expose the photo-resist layer 102, the exposure light source 110 can emit the light rays to the photo-resist layer 102 through the mask 120. Subsequently, the light rays passing through the photo-resist layer 102, the transparent electrode layer 103 and the transparent substrate 101 are reflected back by the reflective plate 130 for increasing the exposed extent of the top portion of the photo-resist layer 102, so as to ensuring the photo-resist layer 102 to be exposed sufficiently. Thus, it can be avoided that the bottom portion of the photo-resist layer 102 is not exposed completely due to a small line space or a high depth-to-width ratio.

Figure 2:
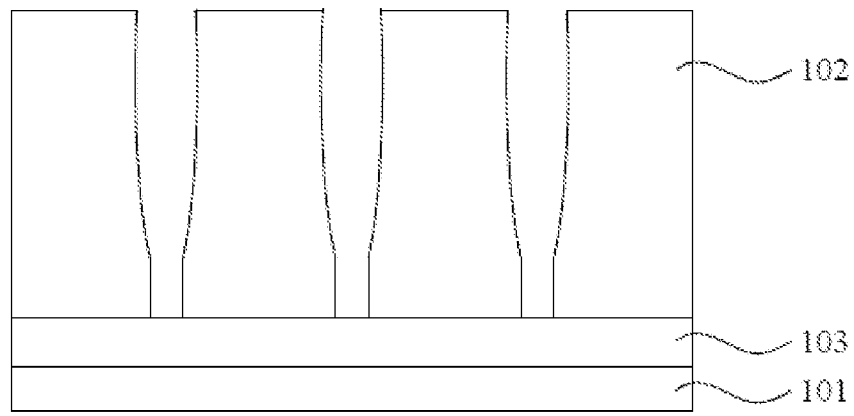
FIG. 2 is a schematic diagram showing a patterned photo-resist layer according to the first embodiment of the present invention.
Figure 3:
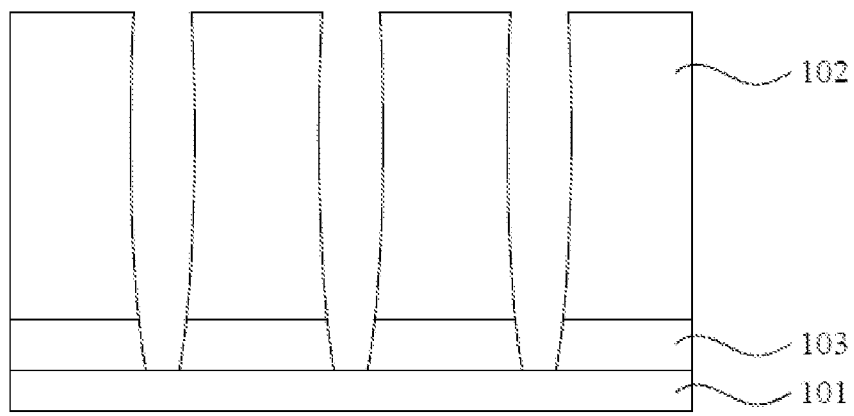
FIG. 3 is a schematic diagram showing an etched transparent electrode layer according to the first embodiment of the present invention.

Referring to FIG. 2 and FIG. 3, FIG. 2 is a schematic diagram showing a patterned photo-resist layer according to the first embodiment of the present invention, and FIG. 3 is a schematic diagram showing an etched transparent electrode layer according to the first embodiment of the present invention. As shown in FIG. 2, after exposing the photo-resist layer, a portion of the photo-resist layer 102 is removed off by a developing step for patterning the photo-resist layer 102. As shown in FIG. 3, subsequently, a portion of the transparent electrode layer 103 which is not sheltered by the patterned photo-resist layer 102 is removed off by an etching step. Subsequently, the patterned photo-resist layer 102 is removed off, so as to achieve the patterned transparent electrode layer 103.

With the use of the exposure apparatus 100 and the exposure method of the present invention, it is ensured that the photo-resist layer 102 can be completely exposed, and thus the line space of the predetermined pattern or the width of the transparent opening 122 of the mask 120 can be reduced. In this embodiment, the line space of the predetermined pattern or the width of the transparent opening 122 of the mask 120 can be less than 3 um, and preferably less than or equal to 2 um.

Figure 4:
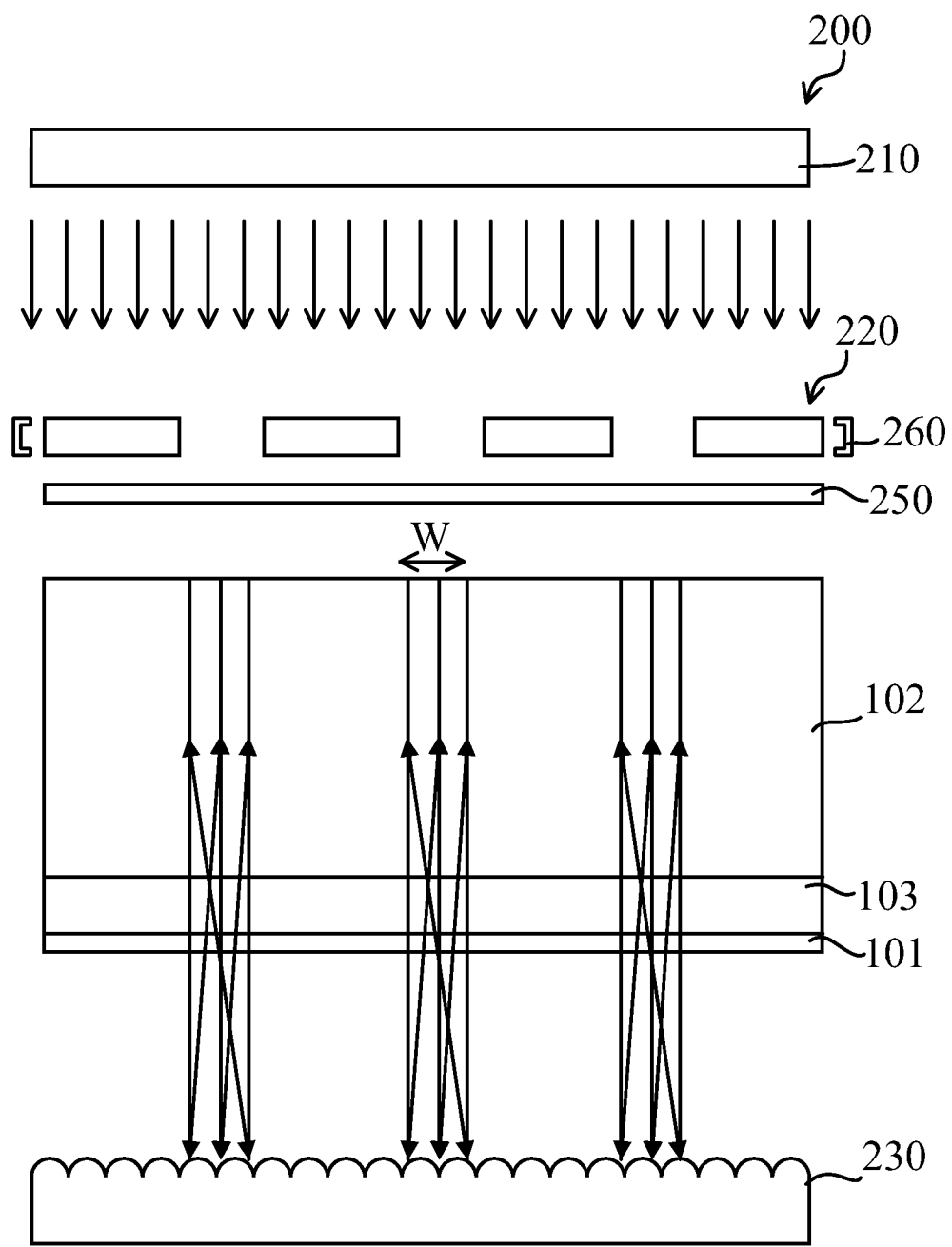
FIG. 4 is a schematic diagram showing an exposure apparatus according to a second embodiment of the present invention.

Referring to FIG. 4, a schematic diagram showing an exposure apparatus according to a second embodiment of the present invention is illustrated. The exposure apparatus 200 of the second embodiment can comprise an exposure light source 210, a mask 220 and a reflective plate 230. The mask 220 is disposed between the exposure light source 210 and the photo-resist layer 102 on the transparent substrate 101. The reflective plate 230 is configured to reflect the light rays passing through the photo-resist layer 102 and the transparent substrate 101 back to the photo-resist layer 102. The exposure apparatus 200 may further comprise a projection reduction lens system 250 disposed between the mask 220 and the transparent substrate 101 for projecting the light rays passing through the mask 220 to the surface of the photo-resist layer 102. Moreover, the mask 220 can be positioned to the photo-resist layer 102 on the transparent substrate 101 by using an aligner 260. In comparison with the first embodiment, the reflective plate 230 of the second embodiment includes a plurality of convex structures which face to the transparent substrate 101. Therefore, the reflective convex surfaces can act as convex mirrors.

Figure 5:
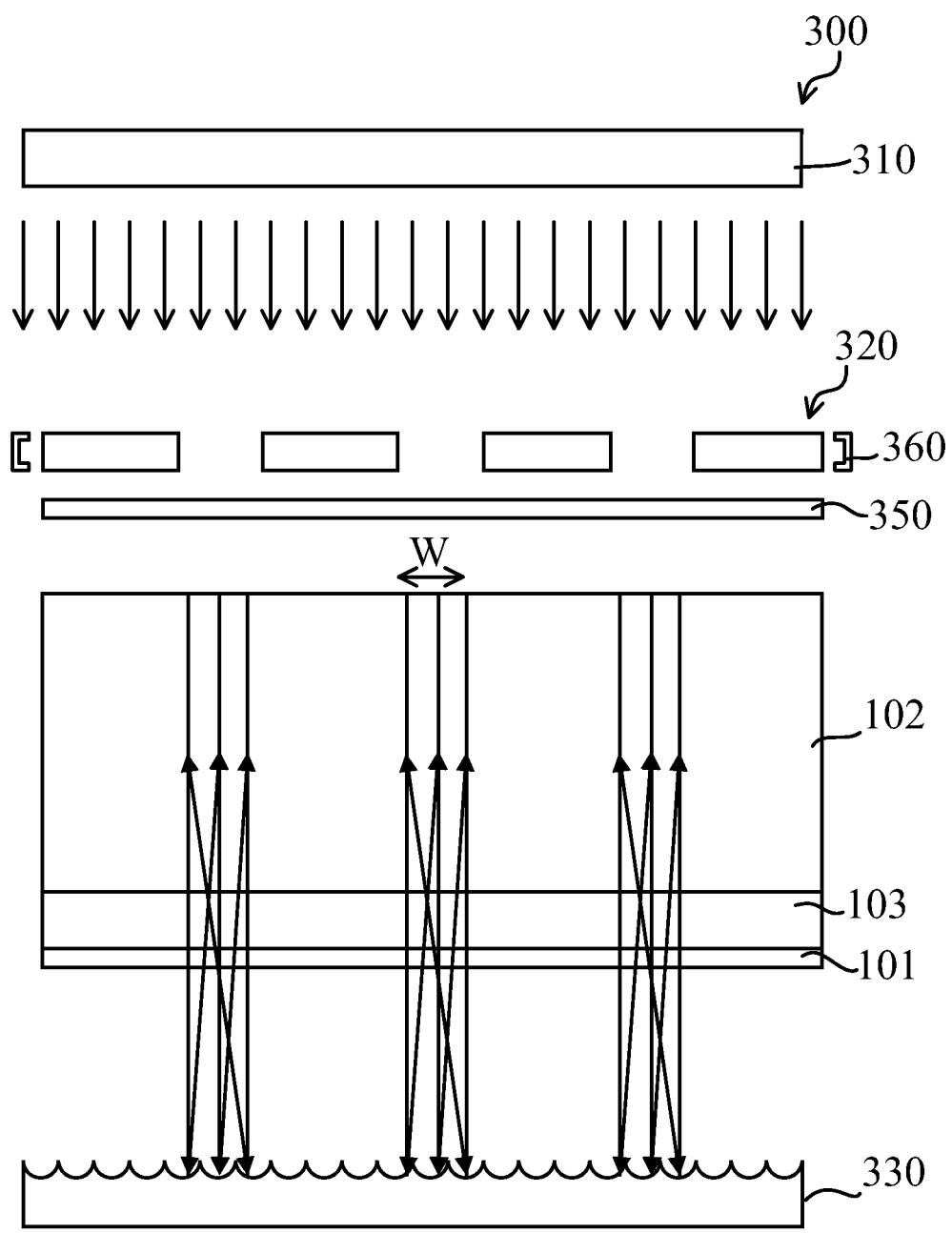
FIG. 5 is a schematic diagram showing an exposure apparatus according to a third embodiment of the present invention.

Referring to FIG. 5, a schematic diagram showing an exposure apparatus according to a third embodiment of the present invention is illustrated. The exposure apparatus 300 of the third embodiment can comprise an exposure light source 310, a mask 320 and a reflective plate 330. The mask 320 is disposed between the exposure light source 310 and the photo-resist layer 102 on the transparent substrate 101. The reflective plate 330 is configured to reflect the light rays passing through the photo-resist layer 102 and the transparent substrate 101 back to the photo-resist layer 102. The exposure apparatus 300 may further comprise a projection reduction lens system 350 disposed between the mask 320 and the transparent substrate 101 for projecting the light rays passing through the mask 320 to the surface of the photo-resist layer 102. Moreover, the mask 320 can be positioned to the photo-resist layer 102 on the transparent substrate 101 by using an aligner 360. In comparison with the first embodiment, the reflective plate 330 of the third embodiment includes a plurality of concave structures which face to the transparent substrate 101. Therefore, the reflective concave surfaces can act as concave mirrors.

As described above, with the use of the exposure apparatus and the exposure method of the present invention, it is ensured that the portion of the photo-resist layer desired to be patterned can absorb enough exposure energy, and the pattern qualifying for the predetermined requirement can be formed after the developing step. Therefore, by means of the exposure apparatus and the exposure method of the present invention, the line space of the desired pattern can be reduced for promoting the performance of electrical devices.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. An exposure apparatus for exposing a photo-resist layer on a transparent substrate, wherein a transparent electrode layer is positioned between the photo-resist layer and the transparent substrate, and the exposure apparatus comprises:
   a mask disposed at one side of the photo-resist layer for patterning the transparent electrode, wherein the mask includes at least one transparent opening, and a width of the transparent opening is less than 2 um;
   an exposure light source configured to provide light rays to the photo-resist layer, wherein the light rays provided by the exposure light source pass through the mask to reach the photo-resist layer;
   a reflective plate disposed at an opposite side of the photo-resist layer for reflecting the light rays passing through the photo-resist layer and the transparent substrate back to the photo-resist layer, wherein the reflective plate is parallel to the photo-resist layer on the transparent substrate when exposing it; and
   a projection reduction lens system disposed between the mask and the transparent substrate for projecting the light rays passing through the mask to a surface of the photo-resist layer, wherein the mask is positioned to the photo-resist layer on the transparent substrate by using an aligner.

2. The exposure apparatus according to claim 1, wherein a reflective surface of the reflective plate is a flat surface.

3. The exposure apparatus according to claim 1, wherein the reflective plate includes a plurality of convex structures.

4. The exposure apparatus according to claim 1, wherein the reflective plate includes a plurality of concave structures.

5. An exposure apparatus for exposing a photo-resist layer on a transparent substrate, wherein a transparent electrode layer is positioned between the photo-resist layer and the transparent substrate, and the exposure apparatus comprises:
   a mask disposed at one side of the photo-resist layer for patterning the transparent electrode;
   an exposure light source configured to provide light rays to the photo-resist layer, wherein the light rays provided by the exposure light source pass through the mask to reach the photo-resist layer;
   a reflective plate disposed at an opposite side of the photo-resist layer for reflecting the light rays passing through the photo-resist layer and the transparent substrate back to the photo-resist layer; and
   a projection reduction lens system disposed between the mask and the transparent substrate for projecting the light rays passing through the mask to a surface of the photo-resist layer, wherein the mask is positioned to the photo-resist layer on the transparent substrate by using an aligner.

6. The exposure apparatus according to claim 5, wherein the mask includes at least one transparent opening, and a width of the transparent opening is less than 3 um.

7. The exposure apparatus according to claim 6, characterized in that: the width of the transparent opening is equal to or less than 2 um.

8. The exposure apparatus according to claim 5, characterized in that: a reflective surface of the reflective plate is a flat surface.

9. The exposure apparatus according to claim 5, characterized in that: the reflective plate includes a plurality of convex structures.

10. The exposure apparatus according to claim 5, characterized in that: the reflective plate includes a plurality of concave structures.

11. The exposure apparatus according to claim 5, characterized in that: the reflective plate is parallel to the photo-resist layer on the transparent substrate when exposing the photo-resist layer.

12. An exposure method for exposing a photo-resist layer on a transparent substrate, wherein a transparent electrode layer is positioned between the photo-resist layer and the transparent substrate, and the exposure method comprises the following steps:

utilizing an exposure light source to provide light rays to the photo-resist layer, wherein the light rays provided by the exposure light source pass through the mask to reach the photo-resist layer for patterning the transparent electrode; and utilizing a reflective plate to reflect the light rays passing through the photo-resist layer and the transparent substrate back to the photo-resist layer;

wherein a projection reduction lens system is disposed between the mask and the transparent substrate for projecting the light rays passing through the mask to a surface of the photo-resist layer, and the mask is positioned to the photo-resist layer on the transparent substrate by using an aligner.

13. The exposure method according to claim 12, wherein the mask includes at least one transparent opening, and a width of the transparent opening is less than 3 um.

14. The exposure method according to claim 12, wherein the reflective plate is parallel to the photo-resist layer on the transparent substrate when exposing the photo-resist layer.

15. The exposure method according to claim 12, wherein, when utilizing the reflective plate to reflect the light rays, the transparent substrate is carried on the reflective plate.

\* \* \* \* \*